United States Patent
Lin et al.

(10) Patent No.: US 6,472,235 B1
(45) Date of Patent: Oct. 29, 2002

(54) APPARATUS AND METHOD FOR PREPARING BACKSIDE-GROUND WAFERS FOR TESTING

(75) Inventors: Kuang-Peng Lin; Hung-Jen Tsai, both of Hsin-Chu; Hsien-Tsong Liu, Hsien-Chu, all of (TW)

(73) Assignee: Taiwan Semiconductor Manufacturing Co., Ltd, hsin Chu (TW)

( * ) Notice: Subject to any disclaimer, the term of this patent is extended or adjusted under 35 U.S.C. 154(b) by 0 days.

(21) Appl. No.: 09/886,881

(22) Filed: Jun. 21, 2001

(51) Int. Cl.$^7$ ................................. H01L 21/66
(52) U.S. Cl. ................. 438/14; 438/15; 438/16; 438/959; 438/401; 365/63; 257/620
(58) Field of Search ............... 438/14, 15, 16, 438/959, 401; 365/63, 233, 185; 257/620

(56) References Cited

U.S. PATENT DOCUMENTS

| | | | | |
|---|---|---|---|---|
| 5,520,769 A | * | 5/1996 | Barrett et al. | 156/626.1 |
| 5,622,875 A | * | 4/1997 | Lawrence | 438/691 |
| 6,096,567 A | * | 8/2000 | Kaplan et al. | 438/14 |
| 6,121,061 A | * | 9/2000 | Van Bilsen et al. | 438/14 |
| 6,141,245 A | * | 10/2000 | Bertin et al. | 365/185.05 |
| 6,268,641 B1 | * | 7/2001 | Yano et al. | 257/620 |
| 6,348,364 B1 | * | 2/2002 | Bruce et al. | 438/108 |
| 6,243,283 B1 | * | 5/2002 | Bertin et al. | 365/63 |
| 6,395,569 B1 | * | 5/2002 | Laureanti | 438/18 |

OTHER PUBLICATIONS

US 6,391,663, 5/2002, Akram et al. (withdrawn)*

* cited by examiner

Primary Examiner—Richard Booth
Assistant Examiner—Olivia T Luk
(74) Attorney, Agent, or Firm—Tung & Associates

(57) ABSTRACT

A method and an apparatus for preparing a backside-ground wafer for testing are described. The method includes the steps of first providing a calibration wafer that has a pattern formed on a top surface of an insulating material such as oxide or nitride. Three droplets of water are applied with each droplet sufficiently apart from the other droplets on the top surface of the calibration wafer. A backside-ground wafer that has a ground backside and a front side to be tested is then mated to the calibration wafer by mating the ground backside to the top surface of the calibration wafer with water droplets therein-between forming a bond by capillary reaction in-between the oxide pattern on the calibration wafer. The apparatus for mounting a backside-ground wafer to a calibration wafer consists of a slanted block having a top surface with a slant angle between about 10° and about 30°.

13 Claims, 2 Drawing Sheets

Before Attach

After Attach

APPARATUS AND METHOD FOR PREPARING BACKSIDE-GROUND WAFERS FOR TESTING

FIELD OF THE INVENTION

The present invention generally relates to an apparatus and a method for preparing a backside-ground wafer for testing and more particularly, relates to an apparatus and a method for preparing a backside-ground wafer for testing by assembling a calibration wafer to the backside of the backside-ground wafer such that the total thickness is within the test machine tolerance for a wafer thickness.

BACKGROUND OF THE INVENTION

A backlapping or backside grinding process is frequently used in semiconductor processing for thinning a wafer in order to achieve a smaller thickness, planarity and parallelism of the top and bottom surfaces of a wafer. Since a wafer polishing process can only remove a maximum thickness from a wafer of about 5 μm, a wafer polishing process cannot be used effectively to reduce the thickness, or to correct the curvature of a wafer and to achieve parallelism of the surfaces. The backlapping process, or the backside grinding process is thus used before a wafer polishing process to achieve major thickness reductions. The wafer lapping process is normally carried out in a lapping apparatus which may be used for a single-side lapping or for a double-side lapping.

In a typical backside grinding process, a thickness of the silicon wafer of about 10 mil (or about 250 μm) is removed from the backside of the wafer. For instance, for a six-inch wafer, a reduction of thickness from about 25 mil to about 15 mil, while for an eight-inch wafer, a reduction from about 29 mil to about 19 mil.

While a silicon wafer is normally inspected for defects or for thickness and optical properties of the wafer before the backside grinding process, there are circumstances where after a backside of a wafer is already removed by a grinding process, further tests for either defect or for thickness and optical properties may become necessary. Problems occur when such backside-ground wafers no longer fit in a test machine that was designed for holding a wafer that has full thickness, i.e. a thickness prior to the backside grinding process. For instance, a KLA defect inspection machine would hold a six-inch wafer within a thickness specification of 25 mil±1 mil, or hold an eight-inch wafer within a thickness specification of 29 mil±1 mil. A backside-ground wafer thus cannot be mounted in such an inspection machine and be tested. This presents a serious problem for a fabrication facility when a wafer, after a backside grinding process, is returned by a customer for further testing of defects.

It is therefore an object of the present invention to provide a method for preparing a backside-ground wafer for testing that does not have the drawbacks or shortcomings of the conventional methods.

It is another object of the present invention to provide a method for preparing a backside-ground wafer for testing by laminating a calibration wafer to the backside-ground wafer for mounting into a test machine.

It is a further object of the present invention to provide a method for preparing a backside-ground wafer for testing by bonding a calibration wafer to the backside of the backside-ground wafer by at least three drops of water applied therein between.

It is another further object of the present invention to provide a method for preparing a backside-ground wafer for testing by mounting a calibration wafer to the backside of the wafer through the capillary reaction of at least three drops of water applied therein-between.

It is still another object of the present invention to provide a method for preparing a backside-ground wafer for testing by mounting a calibration wafer to the backside-ground wafer in a specially designed wafer mounting block that has a slanted surface.

It is yet another object of the present invention to provide an apparatus for mounting a backside-ground wafer to a calibration wafer which consists of a slanted block having a slant angle measured from a horizontal plane between about 10° and about 30°.

It is still another further object of the present invention to provide an apparatus for mounting a backside-ground wafer to a calibration wafer by using a slanted block that is formed of a rigid material such as aluminum or a rigid plastic.

SUMMARY OF THE INVENTION

In accordance with the present invention, a method and an apparatus for preparing a backside-ground wafer for testing are provided.

In a preferred embodiment, a method for preparing a backside-ground wafer for testing can be carried out by the steps of first providing a calibration wafer that has a pattern formed of an insulating material on a top side; applying at least three drops of water with each one sufficiently apart from the others on the top side of the calibration wafer; providing a backside-ground wafer that has a ground backside and a front side to be tested; and mating the ground backside of the backside-ground wafer to the top side of the calibration wafer intimately with the at least three drops of water therein-between.

The method for preparing a backside-ground wafer for testing may further include the step of providing a calibration wafer with an oxide pattern formed on a top surface, or the step of providing a calibration wafer with an oxide pattern that has a thickness of at least 2000 Å formed on a top surface.

The method may further include the step of providing a calibration wafer that has a silicon nitride pattern formed on a top surface, or the step of applying at least five drops of water with each one sufficiently apart from the others on the top side of the calibration wafer. The method may further include the step of forming the pattern of an insulating material on the calibration wafer to a thickness of at least 3000 Å.

The present invention is further directed to an apparatus for mounting a backside-ground wafer to a calibration wafer for testing which includes a slanted block formed of a rigid material that has a top surface with a slant angle measured from a horizontal plane between about 10° and about 30°, the top surface generally has a rectangular shape; a stopper of linear, elongated shape that has a height of at least 5 mm fixedly positioned at and parallel to a bottom edge of the top surface of the slanted block; and two guiding strips of linear, elongated shape which has a height of at least 5 mm fixedly positioned spaced-apart and parallel to two sides of the top surface, the two guiding strips are spaced-apart by a distance that is at least a diameter of the calibration wafer.

In the apparatus for mounting a backside-ground wafer to a calibration wafer, the two guiding strips are spaced-apart by a distance of at least 202 mm, or by a distance of at least 302 mm. The apparatus may further include an annular-shaped recess in the top surface of the slanted block that is at least 5 mm deep with a diameter of at least 202 mm, or an annular-shaped recess in the top surface of the slanted block that is at least 5 mm deep with a diameter of at least 302 mm. The slanted block may be formed of aluminum, or of a rigid plastic.

The present invention is still further directed to a method for preparing a backside-ground wafer for testing by using a wafer mounting block which includes the operating steps of providing a wafer mounting block that includes a slanted block formed of a rigid material that has a top surface with a slant angle from a horizontal plane between about 10° and about 30°, the top surface generally has a rectangular shape; a stopper of linear, elongated shape that has a height of at least 5 mm fixedly positioned at and parallel to a bottom edge of the top surface of the slanted block; two guiding strips of linear, elongated shape that have a height of at least 5 mm fixedly positioned spaced-apart and parallel to two sides of the top surface, the two guiding strips are spaced-apart by a distance that is at least a diameter of the calibration wafer; positioning a calibration wafer that has a pattern formed of an insulating material on a top side of the top surface of the slanted block in-between the stopper and the two guiding strips; applying at least three drops of water with each one sufficiently apart from the others on the top side of the calibration wafer; providing a backside-ground wafer that has a ground backside and a front side to be tested; mating the ground backside of the backside-ground wafer to the top side of the calibration wafer intimately with the at least three drops of water therein-between; and removing a calibration wafer/backside-ground wafer assembly that is bounded together from the wafer mounting block.

The method for preparing a backside-ground wafer for testing by using a wafer mounting block may further include the steps of conducting a test on the front side of the backside-ground wafer; heating the calibration wafer/backside-ground wafer assembly at a temperature of at least 100° C. for a time of at least 3 min; and separating the backside-ground wafer from the calibration wafer.

The method for preparing a backside-ground wafer for testing may further include the step of providing a calibration wafer with an oxide pattern formed on a top side, or with an oxide pattern that has a thickness of at least 2000 Å formed on a top side. The method may further include the step of providing a calibration wafer with a silicon nitride pattern formed on a top side. The method may further include the step of applying at least five drops of water with each one sufficiently spaced-apart from the others on the top side of the calibration wafer. The method may further include the step of forming the pattern of an insulating material on the calibration wafer to a thickness of at least 3000 Å.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for preparing a backside-ground wafer for testing by forming an assembly with a calibration wafer which is bonded to the backside-ground wafer by drops of water through a capillary principle. The calibration wafer normally has an oxide pattern formed on a top surface, or a pattern formed of any insulating material on a top surface with which the wafer to be tested is bonded to. The oxide pattern, or the pattern formed by any other insulating material, should have a height of at least 2000 Å, and preferably at least 3000 Å such that when two wafers are mated together with droplets of water applied therein-between, the capillary reaction of water holds the two wafers together with a sufficient bond strength such that the backside-ground wafer can be tested in a test machine. The present invention bonding method by droplets of water through a capillary reaction principle is more superior than bonding the two wafers together with an adhesive and forming a permanent bond. The present invention bonded assembly can be easily separated by heating the assembly in an oven, or on a hot plate to a temperature of at least 100° C. for a time period as short as 3 min. As soon as the water droplets in-between the two wafers vaporize, the two wafers can be easily separated.

The present invention further discloses an apparatus for mounting a backside-ground wafer to a calibration wafer for testing which includes a slanted block with a stopper and two guiding strips mounted on a top surface. The slanted block may be formed of a rigid material with a top surface that has a slant angle measured from a horizontal plane between about 10° and about 30°. The top surface of the slanted block generally has a rectangular shape with a bottom edge equipped with a stopper of linear, elongated shape that has a height of at least 5 mm fixedly positioned at and parallel to the bottom edge. Along the two sides of the top surface of the slanted block, is further mounted two guiding strips of linear, elongated shape each having a height of at least 5 mm fixedly positioned spaced-apart and parallel to the two sides of the top surface. The two guiding strips are spaced-apart by a distance that is at least a diameter of the calibration wafer, i.e. that is at least 200 mm or at least 300 mm. A suitable distance between the two spaced-apart guiding strips may be about 202 mm or about 302 mm.

The present invention still further discloses a method for preparing a backside-ground wafer for testing by using a wafer mounting block by first providing a mounting block such as one described above, then mounting a calibration wafer to a backside-ground wafer with at least three droplets of water therein-between such that the two wafers are bonded together in a temporary bond formed by the capillary reaction of water.

Figure 1:
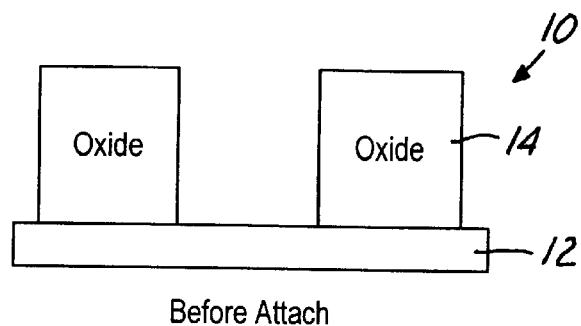
FIG. 1 is an enlarged, cross-sectional view of a calibration wafer used in the present invention method.

Referring now to FIG. 1, wherein an enlarged, cross-sectional view of a calibration wafer 10 is shown. The calibration wafer 10 consists of a silicon wafer 12 that has an oxide layer 14 formed and patterned on top of the substrate. A suitable thickness for the oxide layer is at least 2000 Å, and preferably at least 3000 Å. It should be noted that FIG. 1 is shown for illustration purposes only and therefore not to scale. For instance, the thickness of the silicon wafer 12 should be at least 10 μm which is many orders of magnitude greater than the thickness of the oxide layer which is only 3000 Å. The thickness of the oxide layer 14 is greatly exaggerated in FIG. 1 for illustration purposes. While an oxide layer 14 is shown in FIG. 1, a pattern formed by any other insulating material, such as silicon nitride or TEOS oxide layer that is patterned may similarly be utilized. The important requirement is that there must be small gaps formed between the oxide pattern and the two wafer surfaces in order to produce a desirable capillary effect for forming the bond.

Figure 2:
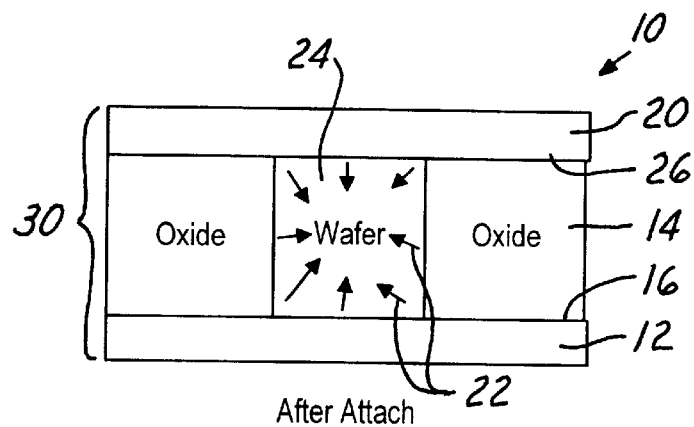
FIG. 2 is an enlarged, cross-sectional view of the present invention calibration wafer with a backside-ground wafer mounted on top.

For instance, FIG. 2 shows an enlarged, cross-sectional view of a backside-ground wafer 20 that is bonded by capillary force 22 due to the presence of a droplet of water 24 that fills a gap formed between the calibration wafer 12, the backside-ground wafer 20 and the oxide pattern 14. The amount of water necessary to form the capillary reaction between the two wafer surfaces 16 and 26 is very minimal, for instance, as little as 5 droplets of water for a six-inch wafer. The droplets of water can be applied with one drop at each corner of the wafer and one drop at the center of the wafer in the case of the six-inch wafer.

After the calibration wafer/backside-ground wafer assembly is mounted in a test machine for testing defect counts, i. e. such as in a KLA machine, or in any other suitable test machine for measuring thickness or optical properties, the assembly 30 can be easily disassembled by heating the assembly either in an oven or on a hot plate to a temperature slightly higher than 100° C. for a time period not less than 3 min., or preferably for 5 min. to vaporize the water droplets away. As soon as the water droplets are vaporized, the two wafers can be easily separated by simply prying on the edges of the wafers.

Figure 3:
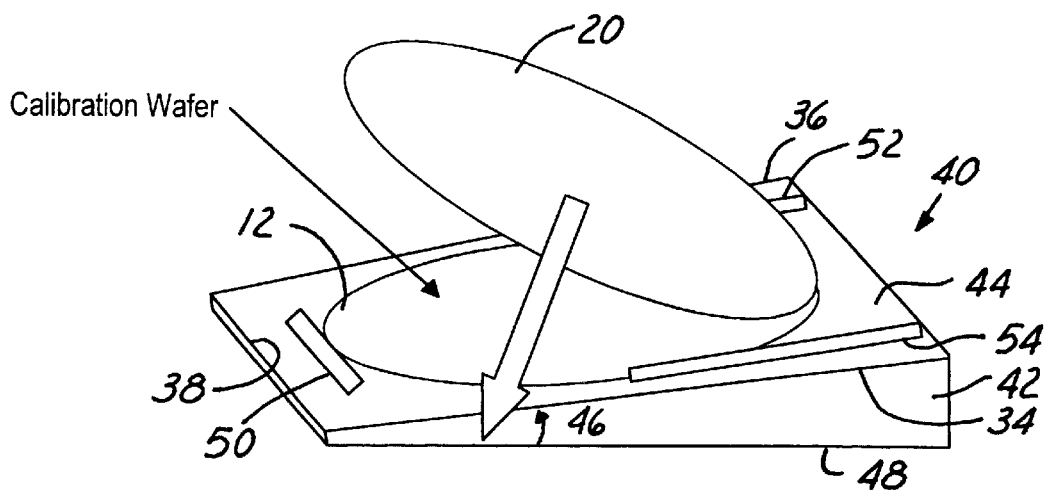
FIG. 3 is a perspective view of the present invention apparatus for mounting a backside-ground wafer to a calibration wafer.

The present invention further discloses an apparatus 40, as shown in FIG. 3 in a perspective view, that is used to facilitate the mounting of a backside-ground wafer 20 to the calibration wafer 12. The apparatus 40 can be constructed by a slanted block 42 which is formed of a rigid material, such as aluminum or a rigid plastic. The slanted block 42 is equipped with a top surface 44 that has a slant angle 46 measured from a horizontal plane 48, or from the bottom of the slanted block 42, between about 10° and about 30°. The top surface 44 of the slanted block 42 generally has a rectangular shape with a bottom edge 38 and two sides 34,36. On top of the surface 44 of the slanted block 42, a stopper 50 of linear, elongated shape with a height of at least 5 mm is fixedly positioned at and parallel to the bottom edge 38 of the top surface 44. The top surface 44 is further provided with two guiding strips 52,54 of linear, elongated shape each with a height of at least 5 mm fixedly positioned spaced-apart and parallel to the two sides 34,36 of the top surface 44. The two guiding strips 52,54 are spaced-apart by a distance that is at least a diameter of the calibration wafer, i.e. of either 200 mm (eight-inch) or 300 mm (12"). The distance is thus about 202 mm or about 302 mm in order for the wafer to slide in and out easily between the two guiding strips 52,54.

Figure 4:
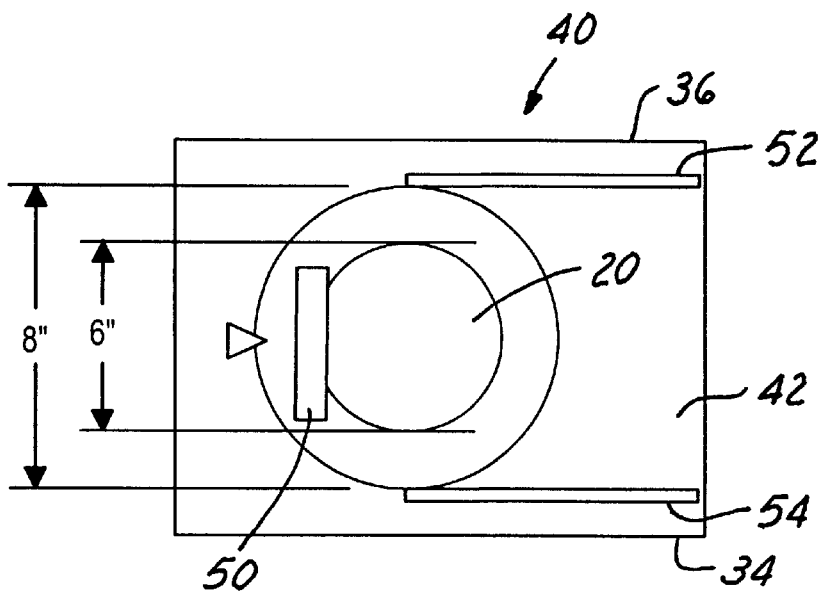
FIG. 4 is a plane view of the present invention apparatus of FIG. 3.

A plane view of the present invention slanted block 42 is shown in FIG. 4, wherein a moveable stopper 50 is shown. For instance, when stopper 50 is pushed in at the shown position, a six-inch wafer 20 that is backside-ground can be mounted to a calibration wafer (not shown) that is positioned underneath. When the stopper 50 is moved to the left, the slanted block 42 can be used for mounting an eight-inch wafer as shown in FIG. 4 by the larger circle.

Figure 5:
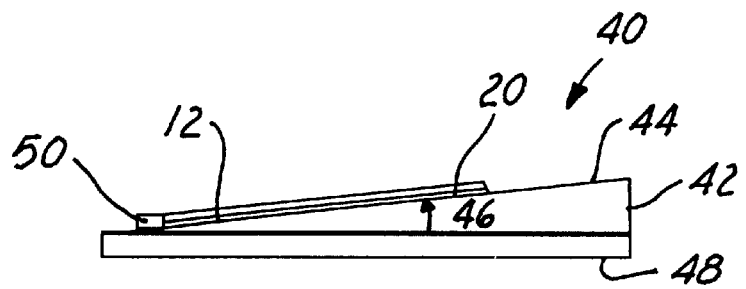
FIG. 5 is a side view of the present invention apparatus of FIG. 4.

FIG. 5 shows a side view of the slanted block 42 of FIG. 4 illustrating a slant angle 46 between about 10° and about 30°.

Figure 6:
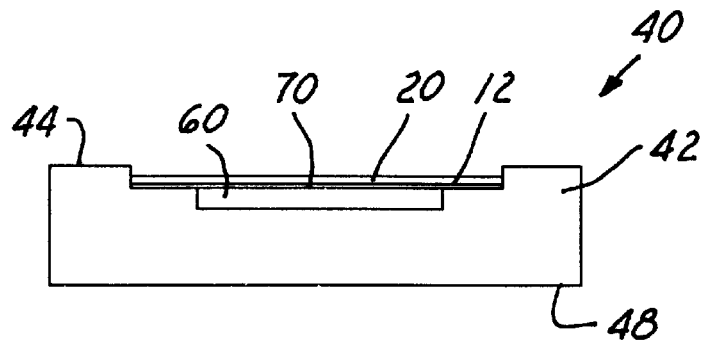
FIG. 6 is an end view of the present invention apparatus shown in a second embodiment having recessed surfaces.

In an alternate embodiment, instead of the stopper 50 utilized, a recessed groove 60 may be provided in the top surface 44 of the slanted block 42. As shown in FIG. 6, the recess is provided for two different sized wafers, i.e. recess 60 is provided for six-inch wafers, while recess 70 is provided for eight-inch wafers 12,20. With the use of the recesses 60,70 in the top surface 44 of the slanted block 42, the use of the two guiding strips 52,54 can also be eliminated. FIG. 6 is shown in a cross-sectional view taken transversely along the slanted block 42.

The present invention novel method and apparatus for preparing a backside-ground wafer for testing have therefore been amply described in the above description and in the appended drawings of FIGS. 1~6.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for preparing a backside-ground wafer for testing comprising the steps of:
   providing a calibration wafer that has a pattern formed of an insulating material on a top side;
   applying at least three drops of water with each one sufficiently apart from the others on said top side of the calibration wafer;
   providing a backside-ground wafer having a ground backside and a front side to be tested; and
   mating said ground backside of the backside-ground wafer to said top side of the calibration wafer intimately with said at least three drops of water therein between.

2. A method for preparing a backside-ground wafer for testing according to claim 1 further comprising the step of providing a calibration wafer with an oxide pattern formed on a top side.

3. A method for preparing a backside-ground wafer for testing according to claim 1 further comprising the step of providing a calibration wafer with an oxide pattern that has a thickness of at least 2000 Å on a top side.

4. A method for preparing a backside-ground wafer for testing according to claim 1 further comprising the step of providing a calibration wafer with a silicon nitride pattern formed on a top side.

5. A method for preparing a backside-ground wafer for testing, according to claim 1 further comprising the step of applying at least five drops of water with each one sufficiently apart from the others on said top side of the calibration wafer.

6. A method for preparing a backside-ground wafer for testing according to claim 1 further comprising the step of forming said pattern of an insulating material on said calibration wafer to a thickness of at least 3000 Å.

7. A method for preparing a backside-ground wafer for testing by using a wafer mounting block comprising the steps of:

providing a wafer mounting block that comprises:
  a slanted block formed of a rigid material having a top surface with a slant angle from a horizontal plane between about 10° and about 30°, said top surface generally having a rectangular shape;
  a stopper of linear, elongated shape having a height of at least 5 mm fixedly positioned at and parallel to a bottom edge of said top surface of the slanted block;
  two guiding strips of linear, elongated shape having a height of at least 5 mm fixedly positioned spaced-apart and parallel to two sides of said top surface, said two guiding strips are spaced-apart by a distance that is at least a diameter of said calibration wafer;
positioning a calibration wafer that has a pattern formed of an insulating material on a top side on said top surface of the slanted block in-between said stopper and said two guiding strips;
applying at least three drops of water with each one sufficiently apart from the others on said top side of the calibration wafer;
providing a backside-ground wafer having a ground backside and a front side to be tested;
mating said ground backside of the backside-ground wafer to said top side of the calibration wafer intimately with said at least three drops of water therein between; and
removing a calibration wafer/backside-ground wafer assembly that are bonded together from said wafer mounting block.

8. A method for preparing a backside-ground wafer for testing by using a wafer mounting block according to claim 7 further comprising the steps of:

conducting a test on said front side of said backside-ground wafer;
heating said calibration wafer/backside-ground wafer assembly at a temperature of at least 100° C. for a time of at least 3 min; and
separating said backside-ground wafer from said calibration wafer.

9. A method for preparing a backside-ground wafer for testing according to claim 7 further comprising the step of providing a calibration wafer with an oxide pattern formed on a top side.

10. A method for preparing a backside-ground wafer for testing according to claim 7 further comprising the step of providing a calibration wafer with an oxide pattern that has a thickness of at least 2000 Å on a top side.

11. A method for preparing a backside-ground wafer for testing according to claim 7 further comprising the step of providing a calibration wafer with a silicon nitride pattern formed on a top side.

12. A method for preparing a backside-ground wafer for testing according to claim 7 further comprising the step of applying at least five drops of water with each one sufficiently apart from the others on said top side of the calibration wafer.

13. A method for preparing a backside-ground wafer for testing according to claim 7 further comprising the step of forming said pattern of an insulating material on said calibration wafer to a thickness of at least 3000 Å.

* * * * *